United States Patent [19]
Seko et al.

[11] Patent Number: 5,491,709
[45] Date of Patent: Feb. 13, 1996

[54] SEMICONDUCTOR LASER DEVICE

[75] Inventors: Yasuji Seko; Hiromi Otoma; Nobuaki Ueki; Hideki Fukunaga; Hideo Nakayama; Kiichi Ueyanagi, all of Kanagawa; Yasuhiro Shiraki, Tokyo, all of Japan

[73] Assignees: Fuji Xerox Co., Ltd.; Yasuhiro Shiraki, both of Tokyo, Japan

[21] Appl. No.: 106,700

[22] Filed: Aug. 16, 1993

[30] Foreign Application Priority Data

Aug. 20, 1992 [JP] Japan .................................. 4-221089

[51] Int. Cl.⁶ ..................................................... H01S 3/19
[52] U.S. Cl. ............................................................. 372/45
[58] Field of Search ......................................... 372/45, 46

[56] References Cited

U.S. PATENT DOCUMENTS 5,331,655  7/1994  Harder et al. ............................. 372/46

FOREIGN PATENT DOCUMENTS 3-290984  12/1991  Japan .

OTHER PUBLICATIONS

"Low–Threshold Strained GaInP Quantum–Well Ridge Lasers with AlGaAs Cladding Layers", P. Unger et al., 13th International Semiconductor Laser Conference pp. 188–189 (Sep. 21, 1992).

"Reliable 1–2W CW Red–Emitting (Al)GaInP Diode Laser Array with AlGaAs Cladding Layers", H. Jaeckel et al. Electronics Letters 29(1):101–102 7 Jan. 1993.

*Primary Examiner*—James W. Davie
*Attorney, Agent, or Firm*—Finnegan, Henderson, Farabow, Garrett & Dunner

[57] ABSTRACT

In a semiconductor laser device according to the invention, a clad layer includes first clad layers, each of which has a greater band gap than an active layer and has a thickness of 0.003 to 0.3 μm, and second clad layers each of which has a lower refractive index than the active layer, and the first clad layers are disposed nearer to the active layer than the second clad layers, respectively. In this structure, the first clad layers confine carriers in the active layer while the second clad layers confine the light in the active layer. Since each of the first clad layers is formed of a thin film, the carriers are hard to move outwardly from the active layer due to the tunnel phenomenon thereof and, even if the lattice constant thereof is slightly different, the first clad layer can be lattice matched to a substrate. For this reason, the materials of the second clad layers can be selected without taking into consideration the size of the band gap thereof. This makes it possible to reduce the oscillation threshold value current density of the laser as well as to improve the temperature characteristic of the laser.

18 Claims, 3 Drawing Sheets

SEMICONDUCTOR LASER DEVICE

BACKGROUND OF THE INVENTION

The present invention relates to a semiconductor laser device which is used instead of a gas laser or a solid laser, or a semiconductor laser device which is used as a light source for a laser printer or for an optical disk recording apparatus.

Conventionally, in a semiconductor laser device of a double hetero-structure, as shown in FIG. 5, clad layers 2 holding an active layer 1 between them are respectively formed of a material which has a greater band gap than the active layer 1 and also has a lower refractive index than the active layer 1. Thus, the clad layers 2 act to confine both the light and carriers in the active layer 1.

Also, in a semiconductor laser device of an SCH structure (Separate Confinement Hetero-structure), as shown in FIG. 6, there are provided on the two sides of an active layer 3 through confinement layers 4, each of which has a greater band gap than the active layer 3, clad layers 5 each of which has a lower refractive index and a greater band gap than the confinement layer 4. The clad layers 5 act to confine both the light and carriers in the confinement layers 4. The carriers are further shut in the active layer 3 and emit light. Here, the semiconductor laser of an SCH structure includes a semiconductor laser of a so called well structure having an active layer formed of a thin film which is so thin that a quantum size effect can be obtained.

In order to improve the above SCH structure, there is proposed a structure in which there are provided barrier layers respectively between an active layer and confinement layers and adjacent to the active layer to thereby improve the confinement of carriers (see Japanese Patent Publication No. Hei. 3-290984). However, in this structure as well, each of the clad layers is formed of a material which has a greater band gap and a lower refractive index than the confinement layer and acts to confine the light and carriers in the confinement layers.

As mentioned above, each of the clad layers of the conventional semiconductor laser is formed of a material which has a greater band gap and a lower refractive index than the active layer and confinement layers and performs a function to confine both the light and carriers.

However, the above-mentioned conventional clad layer has the following problems.

In the case of a semiconductor laser which is formed of an AlGaInP system material on a GaAs single crystal substrate, the clad layer is normally 1 to 1.5 μm in thickness and, therefore, the composition y of $(Al_xGa_{1-x})y\ In_{1-y}P$ mixed crystal must be lattice matched accurately to the substrate. Otherwise, a large number of defects such as dislocations and the like will occur in the crystal to produce slight level differences called as cross-hatch on the surface of the crystal, which extremely deteriorates the light emitting property of the laser. However, it is not easy to match accurately and grow the composition y of $(Al_xGa_{1-x})y\ In_{1-y}P$ mixed crystal according to a molecular beam epitaxy method or the like. Also, in the case of the crystal growth for the quantum well laser, the compositions of the clad layers, confinement layers and active layer must be matched in such a manner that, in $(Al_xGa_{1-x})y\ In_{1-y}P$, while the temperatures of the raw material cells are varied to keep y at 0.5, x must be changed accurately, which makes it difficult to manufacture the compositions of the above layers.

Also, in an AlGaInP system materia, the mobility of the electron and positive hole thereof is small, that is, one half or less than that of an AlGaAs system crystal. Since heat generation resulting from current injection to raise the temperature of the laser and lower the oscillation efficiency thereof is almost proportional to the electric resistance ($\propto 1/(mobility \times doping\ density)$) of the clad layer, it is necessary to dope P-type impurities to $(Al_xGa_{1-x})_{0.5}In_{0.5}P$ crystal ($x \geq 0.8$), which is used for the clad layer, at a relatively high density. In the growth of an AlGaInP system crystal according to an MOCVD method, although there is given a report that a high density doping has been accomplished by using Mg for P-type impurities, there are still left many problems to be solved in manufacturing.

Further, the material that has the greatest band gap in the AlGaInP system crystal to be lattice matched to the GaAs substrate is $Al_{0.5}In_{0.5}P$. When each of clad layers is formed of $Al_{0.5}In_{0.5}P$ and an active layer is formed of $Ga_{0.5}In_{0.5}P$, then there is obtained a small band gap difference, that is, about 0.45 eV. Due to this, a carrier is easy to overflow firstly in the active layer, which lowers the oscillation efficiency of the laser as well as the temperature characteristic of the laser. As long as a clad layer is manufactured which is lattice matched to a substrate, it is impossible to expand a band gap more than that of the currently used material and, as means for solving this, there has been only attempted a method to produce a complicated structure such as a multiple quantum barrier structure or the like. In this method, there is used a superlattice which is formed of a super-thin film composed of several atomic layers but it is difficult to produce the superlattice.

SUMMARY OF THE INVENTION

In view of the above, it is an object of the invention to provide a new semiconductor laser device which can solve the above-mentioned conventional manufacturing and characteristic problems.

According to a first aspect of the invention, there is provided a semiconductor laser device comprising two clad layers respectively disposed on the two sides of an active layer, in which each of the clad layers includes a first clad layer having a thickness of 0.003 to 0.3 μm and having a greater band gap than the active layer, and a second clad layer having a lower refractive index than the active layer, and the first clad layer is disposed nearer to the active layer than the second clad layer.

According to a second aspect of the invention, there is provided a semiconductor laser device of an SCH structure comprising two clad layers respectively disposed through confinement layers each having a greater band gap than an active layer, in which the clad layer includes a first clad layer having a thickness of 0.003 to 0.3 μm and having a greater band gap than the confinement layer and second clad layer having a lower refractive index than the confinement layer, and the first clad layer is disposed nearer to the confinement layer than the second clad layer.

According to a third aspect of the invention, the first clad layer is formed of a distorted thin film.

Owing to the above-mentioned structure, according to the present invention, the great band gap of the first clad layer makes it possible to confine carriers in the active layer or in the confinement layers, and also by setting the refractive index of the second clad layer lower than that of the active layer or confinement layer, it is possible to shut the light in the active layer or confinement layers. And, due to the fact that the first clad layer is formed of a thin film having a thickness of 0.003 to 0.3 µm, the carriers (electrons and positive holes) are difficult to move out from the active layer or confinement layers by means of a tunnel effect, and also the first clad layer can be lattice matched to the substrate even if the lattice constant thereof is slightly different. In other words, the first clad layer has a function to confine the carriers and the second clad layer has a function to shut the light, so that the second clad layer can be formed of a material which can be selected regardless of the size of the band gap. This makes it possible to produce a highly efficient semiconductor laser device with ease.

Also, even if the first clad layer is formed of a distorted thin film of a lattice unmatching system material, by limiting the thickness of the film to a range in which dislocation is not allowed to occur (a critical film thickness or less), the crystallinity of the first clad layer will never be deteriorated at all but a good heterogeneous interface can be formed. In the case of the distorted thin film, the thickness of the film may be great to such a degree that the movements of the electrons and positive holes by means of a tunnel phenomenon can be ignored. On the other hand, when the critical film thickness is small, the film thickness may be selected in consideration of both the tunnel phenomenon and dislocation so that there can be obtained a semiconductor laser of a good property.

Besides, the first clad layer might comprise distortional layers. A distortional layer means a layer which does not commensurate to a substrate in lattice. A layer is named of a distortional layer, when a lattice constant of a substrate is defined as $a_{sub}$, and a difference between a lattice constant of a substrate and that of a first clad layer is defined as $\Delta a$, then $\Delta a/a$ is not more than $10^{-3}$. When the first clad layer comprises a distortional layer, a material whose bandgap is greater than that of a second clad layer may be selected, and then moving of carriers is effectively prevented. When the first clad layer comprises a distortional layer, it is preferable that the first clad layer has a structure which hardly causes a crystal dislocation. There are factors causing a crystal dislocation, for example, Burgers vector, Poisson's ratio, distortional ratio, and a thickness of a film, and so on. It is preferable to control a thickness of a film, since it is artificially controlled. The critical thickness of a film which does not cause a crystal dislocation is defined by Matheus's equation, but it sometimes does not match with an experimental value. Therefore, it should be obtained through an experiment.

DETAILED DESCRIPTION OF THE PREFERRED EMBODIMENTS

Next, description will be given hereinbelow of the present invention by way of the embodiments thereof.

(First Embodiment)

Figure 1:
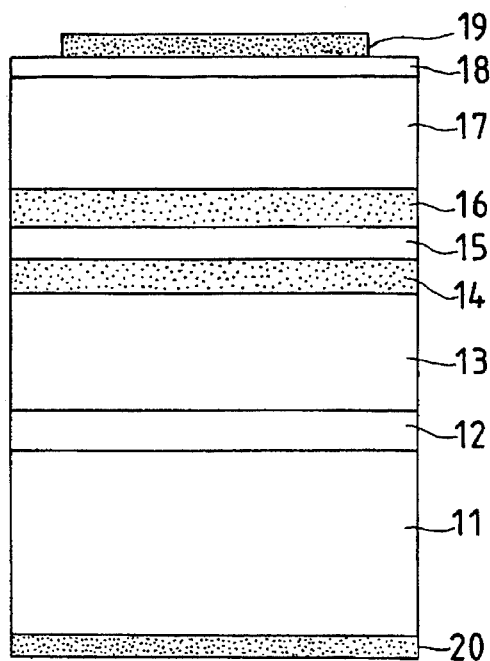
FIG. 1 is a view of a sectional structure of a double heterogeneous laser which is a first embodiment according to the invention.

In FIG. 1, there is shown a structure of a red double hetero-laser which is a first embodiment of a semiconductor laser device according to the present invention. In the first embodiment, the AlInP clad layer of a conventional red semiconductor laser which is formed of only an AlGaInP system material is replaced by a second clad layer of an AlGaAs crystal and a first thin clad layer of AlInP. In this embodiment, the thickness of the first clad layer is selected in the range of 60 to 300 Å which especially prevents the carriers from moving due to the tunnel phenomenon thereof and also can effectively restrict the generation of dislocation with respect to the displacement of the compositions of the first clad layer. In other words, on an n-type GaAs substrate 11, there are laminated sequentially an n-type GaAs buffer layer ($1\times10^{18}/cm^3$) 12 having a thickness of 0.2 µm, an n-type $Al_{0.5}Ga_{0.5}As$ second clad layer ($1\times10^{18}/cm^3$) 13 having a thickness of 1.2 µm, an n-type $Al_{0.5}In_{0.5}P$ first clad layer ($1\times10^{18}/cm^3$) 14 having a thickness of 250 Å, a $Ga_{0.5}In_{0.5}P$ active layer 15 having a thickness of 700 Å, a p-type $Al_{0.5}In_{0.5}P$ first clad layer ($1\times10^{18}/cm^3$) 16 having a thickness of 250 Å, a p-type $Al_{0.5}Ga_{0.5}As$ second clad layer ($1\times10^{18}/cm^3$) 17 having a thickness of 1.2 µm, and a p-type GaAs cap layer ($8\times10^{18}/cm^3$) 18 having a thickness of 0.2 µm. The band gaps and refractive indexes of the respective layers are shown in Table 1.

TABLE 1

|  | Eg (Band Gap) | n (Refractive index) |
| --- | --- | --- |
| Second Clad Layer $Al_{0.5}Ga_{0.5}As$ | 1.97 eV | 3.45 |
| First Clad Layer $Al_{0.5}In_{0.5}P$ | 2.35 eV | 3.28 |
| Active Layer $Ga_{0.5}In_{0.5}P$ | 1.90 eV | 3.65 |

Figure 2:
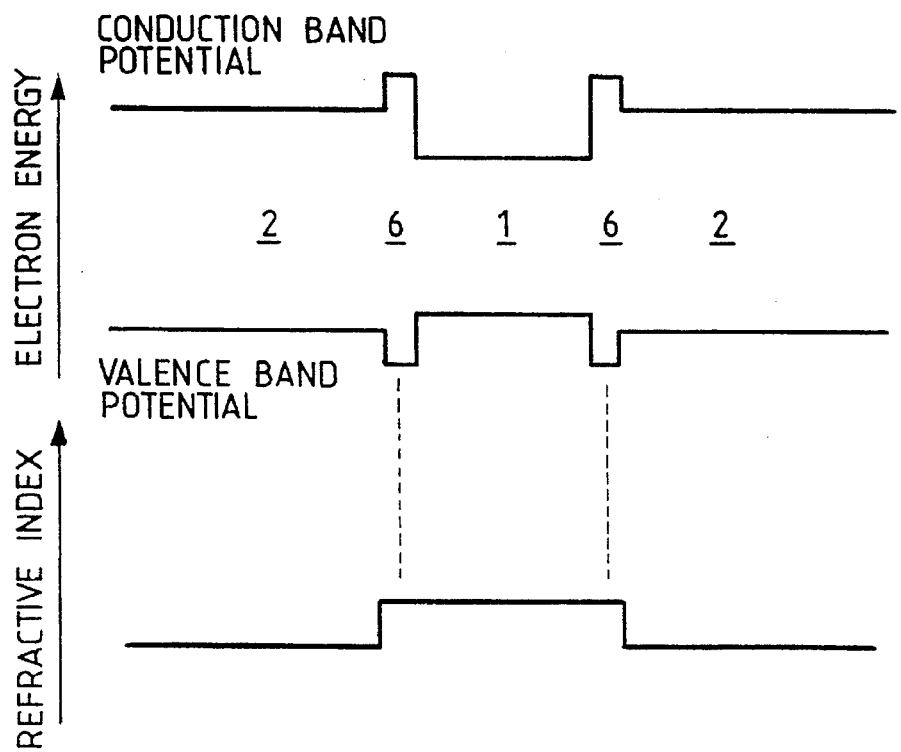
FIG. 2 is a typical view of the band gap and refractive index of a double heterogeneous laser which is first embodiment according to the invention.

In FIG. 2 there is shown a typical view of the band gaps and refractive indexes of the present semiconductor laser. On the two sides of an active layer 1 there are disposed two first clad layers 6 each having a great band gap, and two second clad layers 2 each having a lower refractive index than the active layer 1 are disposed outside the first clad layers 6, respectively.

Next, description will be given below of a method of producing a laser crystal using a gas source MBE (molecular beam epitaxy) method. At first, an n-type GaAs substrate 11, which is set in an ultra-high vacuum growth chamber in a gas source MBE unit, is maintained at a temperature of 500° C. And, an $As_2$ molecular beam obtained by thermally decomposing $AsH_3$ with a high temperature cell and a Ga molecular beam and a Si molecular beam respectively radiated from a cell which is heated to a high temperature are radiated onto the n-type GaAs substrate 11 to thereby grow an n-type GaAs buffer layer ($1\times10^{18}/cm^3$) 12 of a high crystallinity by a thickness of 0.2 µm. Next, an $As_2$ molecular beam as well as Al, Ga, and Si molecular beams are similarly radiated to thereby grow an n-type $Al_{0.5}Ga_{0.5}As$ second clad layer ($1\times10^{18}/cm^3$) 13 by a thickness of 1.2 µm. After then, a $P_2$ molecular beam obtained by thermally decomposing $PH_3$ with a high temperature cell as well as Al, In, and Si molecular beams are radiated to thereby grow an n-type $Al_{0.5}In_{0.5}P$ first clad layer ($1\times10^{18}/cm^3$) 14 by a thickness of 250 Å. Further, a $Ga_{0.5}In_{0.5}P$ active layer 15 is grown by a thickness of 700 Å.

Next $P_2$, Al, In, and Be molecular beams are radiated to thereby grow a p-type $Al_{0.5}In_{0.5}P$ first clad layer ($1\times10^{18}/cm^3$) 16 by a thickness of 250 Å. Similarly, a p-type $Al_{0.5}Ga_{0.5}As$ second clad layer ($1\times10^{18}/cm^3$) 17 is grown by a thickness of 1.2 μm. Lastly, a p-type GaAs cap layer ($8\times10^{18}/cm^3$) 18 is grown by a thickness of 0.2 μm. In this manner, a laser crystal having a double hetero-structure according to the present invention can be produced.

As an example of a method of producing a transversely extending laser structure, a method of producing a contact stripe laser will be described below. The GaAs substrate side of the crystal obtained in the above-mentioned manner is polished to thereby make the thickness of the whole crystal on the order of 100 μm. As a p-type electrode 19, an Au—Zn alloy is vacuum evaporated onto a p-type GaAs cap layer side and, as an n-type electrode 20, an Au—Ge alloy is vacuum evaporated onto an n-type GaAs substrate side. The Au—Zn electrode is etched in a 10 μm stripe according to a photolithography and, after then, there is formed a cleavage surface which is perpendicular to the longitudinal direction of the Au—Zn electrode, thereby producing a resonator structure having a length of 250 μm. In this manner, there is produced a laser chip.

In this embodiment, a first clad layer and an active layer are respectively a thin film with a thickness of several hundred Å or less formed of an AlGaInP system crystal which is lattice unmatched to the GaAs substrate. For this reason, even if the number of growth is increased and the material is decreased to thereby displace slightly the composition of the crystal, the first clad layer and the active layer can be lattice matched to the substrate, which makes it possible to produce a semiconductor laser easily. When the mixed crystal composition is displaced, the lattice constant is different, so that the first clad layer becomes a distorted thin film. Also, since the thick, a second clad layer is formed by use of an AlGaAs system crystal, the electric resistance thereof can be reduced when compared with a conventional clad layer formed of only an AlGaInP system material and also the heat release property thereof can be improved, so as to be able to improve the efficiency of a semiconductor laser.

(Second Embodiment)

Figure 3:
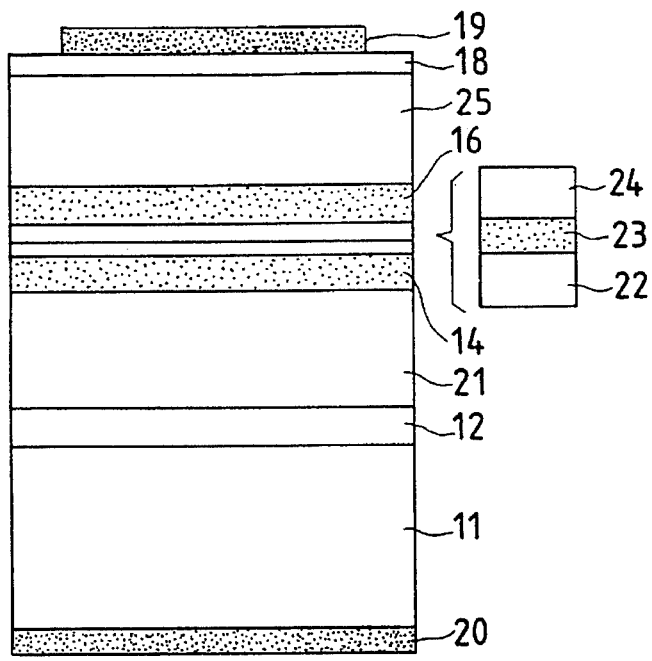
FIG. 3 is a view of a sectional structure of a red quantum well laser which is a second embodiment according to the invention.

In FIG. 3 there is shown a structure of a red quantum well laser which is a second embodiment according to the invention. The red quantum well laser can be obtained in the following manner: that is, in the structure of the red double heterogeneous laser, the compositions of the n-type and p-type $Al_{0.5}Ga_{0.5}As$ second clad layers ($1\times10^{18}/cm^3$) 13 and 17 are changed into $Al_{0.5}Ga_{0.2}As$ second clad layers ($1\times10^{18}/cm^3$) 21 and 25 and further the $Ga_{0.5}In_{0.5}P$ active layer 15 is replaced by $Al_{0.5}Ga_{0.5}As$ confinement layers 22 and 24 each having a thickness of 700 Å and a $Ga_{0.5}In_{0.5}P$ quantum well layer 23 having a thickness of 100 Å. The band gaps and refractive indexes of the respective layers are shown in Table 2. In this structure, especially, the confinement layers 22 and 24 are respectively formed of a lattice matching system material, which can reduce the total film thickness of the lattice unmatching system material to thereby be able to restrict generation of dislocation.

TABLE 2

| | Eg (Band Gap) | n (Refractive Index) |
|---|---|---|
| Second Clad Layer $Al_{0.8}Ga_{0.2}As$ | 2.09 eV | 3.23 |
| First Clad Layer $Al_{0.5}In_{0.5}P$ | 2.35 eV | 3.28 |
| Confinement Layer $Al_{0.5}Ga_{0.5}As$ | 1.97 eV | 3.45 |
| Quantum Well Layer $Ga_{0.5}In_{0.5}P$ | 1.90 eV | 3.65 |

The transversely extending laser structure can be of a contact stripe type similar to the first embodiment.

Figure 4:
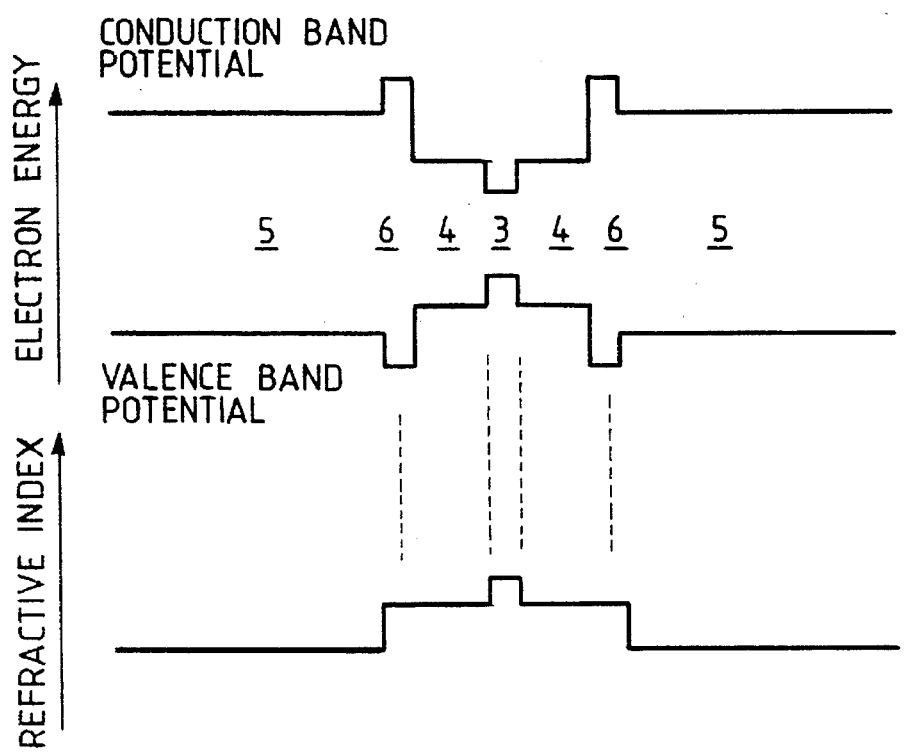
FIG. 4 is a typical view of the band gap and refractive index of a red quantum well laser which is a second embodiment according to the invention.
Figure 5:
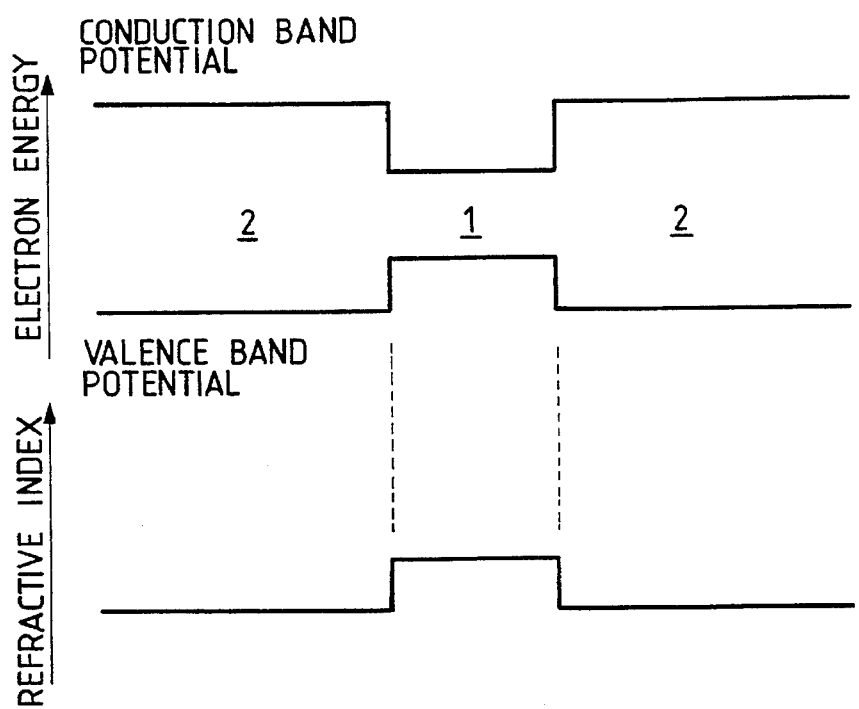
FIG. 5 is a typical view of the band gap and refractive index of a conventional double heterogeneous laser.
Figure 6:
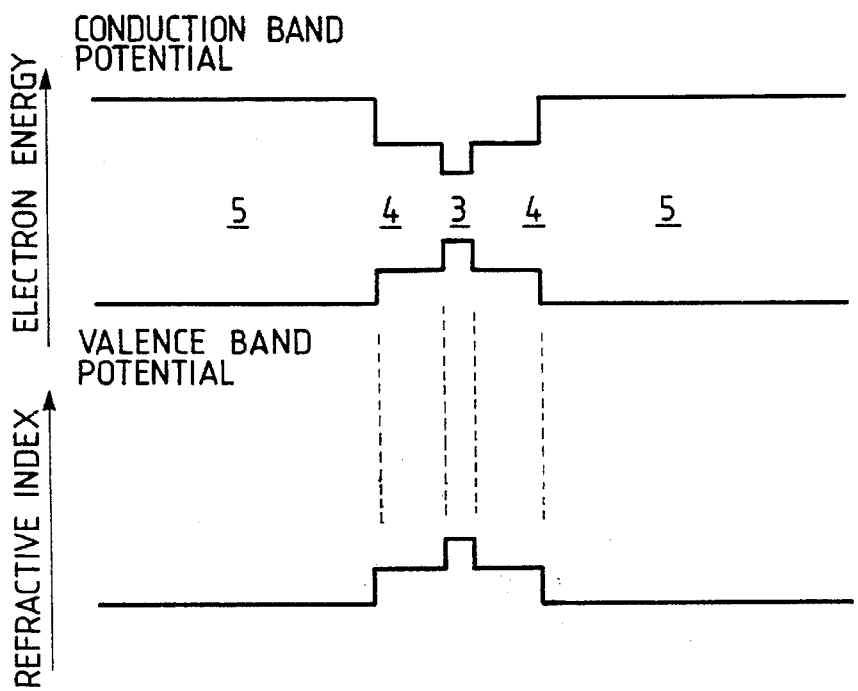
FIG. 6 is a typical view of the band gap and refractive index of a conventional red quantum well laser.

In FIG. 4, there is shown a typical view of the band gaps and refractive indexes of the present semiconductor laser. Two first clad layers 6, each of which is formed of a material having a greater band gap than the confinement layer 4, are respectively disposed between the confinement layers 4 and second clad layers 5, whereby the carriers can be shut in the confinement layers 4 and quantum well layer 3. Also, since the refractive indexes of the second clad layers 5 are lower than those of the confinement layers 4, the light can be shut in the confinement layer 4.

According to the present invention, there can be provided the following effects.

(1) Due to the fact that the first clad layer performs a carrier shutting function, the second clad layer had only to perform a light shutting function. For this reason, for the material of the second clad layer, only the refractive index thereof may be taken into consideration while the size of the band gap thereof can be ignored entirely. This allows a wider range of selection of the material for the laser crystal and thus it is possible to make use of the unique properties of the materials. For example, use of a material having a low electric resistance can release heat efficiently. This makes it possible to reduce the oscillation threshold value current density of the laser as well as to improve the temperature characteristic of the laser.

(2) Due to the fact that the first clad layer can be formed of a lattice unmatching system material so as to shut electrons, the range of selection of the material of the first clad layer can be further widened. That is, it is possible to select a material having a great band gap out of materials differing in the lattice constant. In this case, the first clad layers are distorted thin films respectively having different lattice constants. This can increase the electron confining effect to thereby restrict the overflow of the electrons, which in turn makes it possible to enhance the efficiency of the laser as well as improve the temperature characteristic of the laser.

What is claimed is:

1. A semiconductor laser device, comprising:

an active layer; and clad layers respectively disposed at both sides of said active layer, wherein said clad layers comprise a pair of first clad layers each having a greater band gap than said active layer and having a thickness of not more than 0.3 μm, and a pair of second clad layers each having a lower refractive index than said active layer, and wherein said pair of first clad layers are disposed nearer to said active layer than said pair of second clad layers.

2. The semiconductor laser device of claim 1, wherein said pair of first clad layers have preferably thickness of 0.003 to 0.3 μm.

3. A semiconductor laser of an SCH structure, comprising:

an active layer; and clad layers respectively disposed at both sides of said active layer through confinement layers each having a greater band gap than said active layer, wherein said clad layers include a pair of first clad layers each having a greater band gap than said each confinement layer and thickness of 0.003 to 0.3 μm, and a pair of second clad layers each having lower refractive index than said each confinement layer, and wherein said pair of first clad layers are disposed nearer to said confinement layers than said pair of second clad layers.

4. The semiconductor laser device of claim 1, 2, or 3, wherein said pair of first clad layers are formed of distorted thin films.

5. A semiconductor laser device, comprising:

an active layer; and clad layers respectively disposed at both sides of said active layer, wherein said clad layers include a pair of first clad layers, and a pair of second clad layers, said pair of first clad layers being disposed nearer to said active layer than said pair of second clad layers, said pair of first clad layers have a greater band gap than said second clad layers and have g thickness small enough to suppress defects according to crystal dislocation, and said pair of second clad layers have a lower refractive index than said active layer and a greater band gap than said active layer.

6. The semiconductor laser device of claim 5, further comprising a substrate supporting said all layers thereon.

7. The semiconductor laser device of claim 6, further comprising distortional layers which are not commensurate to said substrate in lattice.

8. The semiconductor laser device of claim 7, wherein $\Delta a/a_{sub}$ is not more than $10^{-3}$, $a_{sub}$ is a lattice constant of said substrate, and $\Delta a$ is a difference between $a_{sub}$ and a lattice constant of said first clad layer.

9. The semiconductor laser device of claim 6, wherein said substrate is a GaAs substrate, said active layer and said pair of first clad layer are made of $(Al_xGa_{1-x})_yIn_{1-y}P$, and said pair of second clad layers are made of AlGaAs.

10. The semiconductor laser device of claim 6, wherein said substrate is a GaAs substrate, said active layer, said confinement layers, and said first clad layers are made of $(Al_xGa_{1-x})_yP$ type crystal, and said second clad layers are made of AlGaAs type crystal.

11. A semiconductor laser device, comprising:

an active layer;

clad layers respectively disposed at both sides of said active layer, and confinement layers disposed between said clad layers and said active layer, wherein said clad layers include a pair of first clad layers, and a pair of second clad layers, said pair of first clad layers being disposed nearer to said active layer than said pair of second clad layers, said pair of first clad layers have a greater band gap than said second clad layers and have g thickness small enough to suppress defects according to crystal dislocation, and said pair of second clad layers have a lower refractive index than said confinement layers and a greater band gap than said confinement layers.

12. The semiconductor laser device of claim 11, further comprising distortional layers which are not commensurate to said substrate in lattice.

13. The semiconductor laser device of claim 12, wherein $\Delta a/a_{sub}$ is not more than $10^{-3}$, $a_{sub}$ is a lattice constant of said substrate, and $\Delta a$ is a difference between $a_{sub}$ and a lattice constant of said first clad layer.

14. The semiconductor laser device of claim 11, further comprising a substrate supporting said all layers thereon.

15. A semiconductor laser device, comprising:

an active layer; and a pair of clad layers respectively disposed at opposite sides of said active layer, wherein each of said clad layers includes:

a first clad layer having a greater band gap than said active layer, and a second clad layer having a lower refractive index than said active layer, and wherein said first clad layers are disposed nearer to said active layer than said second clad layers.

16. A semiconductor laser device according to claim 15, wherein the first clad layer has a thickness of not more than 0.3 microns and is nearer to the active layer than the second clad layer.

17. A semiconductor laser device according to claim 15, wherein the first clad layer has a thickness enough to suppress defects according to crystal dislocation, and the second clad layer has a greater band gap than the active layer.

18. A semiconductor laser device, comprising:

an active layer;

clad layers respectively disposed at both sides of said active layer, wherein said clad layers comprise:

a pair of first clad layers each having a greater band gap than said active layer and having a thickness of not more than 0.3 μm, and a pair of second clad layers each having a lower refractive index than said active layer, and wherein said pair of first clad layers are disposed nearer to said active layer than said pair of second clad layers.

* * * * *

UNITED STATES PATENT AND TRADEMARK OFFICE
CERTIFICATE OF CORRECTION

PATENT NO. : 5,491,709
DATED : February 13, 1996
INVENTOR(S) : Yasuji SEKO et al It is certified that error appears in the above-indentified patent and that said Letters Patent is hereby corrected as shown below:

Claim 5, Column 7, Line 31, "g" should read --a--;

Claim 10, Column 7, Line 54, "$(Al_xGa_{1-x})_yP$" should read --$(Al_xGa_{1-x})_yIn_{1-y}P$--;

Claim 11, Column 8, Line 8, "g" should read --a--.

Signed and Sealed this

Nineteenth Day of November, 1996

Attest:

BRUCE LEHMAN

Attesting Officer · Commissioner of Patents and Trademarks